US008436353B2

(12) United States Patent
Moriguchi et al.

(10) Patent No.: US 8,436,353 B2
(45) Date of Patent: May 7, 2013

(54) THIN FILM TRANSISTOR WITH RECESS

(75) Inventors: Masao Moriguchi, Osaka (JP); Tokuo Yoshida, Osaka (JP); Yuhichi Saitoh, Osaka (JP); Yasuaki Iwase, Osaka (JP); Yosuke Kanzaki, Osaka (JP); Mayuko Sakamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 161 days.

(21) Appl. No.: 13/001,397

(22) PCT Filed: Sep. 14, 2009

(86) PCT No.: PCT/JP2009/004573
§ 371 (c)(1),
(2), (4) Date: Dec. 23, 2010

(87) PCT Pub. No.: WO2010/032425
PCT Pub. Date: Mar. 25, 2010

(65) Prior Publication Data
US 2011/0147756 A1 Jun. 23, 2011

(30) Foreign Application Priority Data
Sep. 16, 2008 (JP) ................................. 2008-237015

(51) Int. Cl.
H01L 29/41 (2006.01)

(52) U.S. Cl.
USPC ..................................... 257/57; 257/E29.275

(58) Field of Classification Search ............ 257/57, 257/66, E29.275, E29.291, E29.294
See application file for complete search history.

(56) References Cited

U.S. PATENT DOCUMENTS
6,555,420 B1* 4/2003 Yamazaki ...................... 438/158
2004/0142502 A1* 7/2004 Yoo et al. ......................... 438/24
2008/0135846 A1* 6/2008 Shin et al. ......................... 257/59

FOREIGN PATENT DOCUMENTS
| JP | 01-267617 A | 10/1989 |
| JP | H5-304171 A | 11/1993 |
| JP | H6-196701 A | 7/1994 |
| JP | 07-092493 A | 4/1995 |
| JP | 2000-223711 A | 8/2000 |
| JP | 2002-100780 A | 4/2002 |
| JP | 2005-49832 A | 2/2005 |
| JP | 2005-51211 A | 2/2005 |

OTHER PUBLICATIONS

Zhongyang Xu et al, "A Novel Thin-film Transistor with μc-Si/a-Si Dual Active Layer Structure for AM-LCD," IDW 96 Proceedings of the Third International Display Workshops, vol. 1, 1996, pp. 117-120.
International Search Report (ISR) issued in PCT/JP2009/004573 (International application) mailed in Oct. 2009 for Examiner consideration.

* cited by examiner

Primary Examiner — Wensing Kuo
(74) Attorney, Agent, or Firm — Chen Yoshimura LLP

(57) ABSTRACT

A semiconductor device 10 according to the present invention includes an active layer 14 supported on a substrate 11 and having two channel regions 14c1, 14c2, a source region 14s, a drain region 14d, and an intermediate region 14m formed between the two channel regions 14c1, 14c2; a contact layer 16 having a source contact region 16s, a drain contact region 16d, and an intermediate contact region 16m; a source electrode 18s; a drain electrode 18d; an intermediate electrode 18m; and a gate electrode 12 facing the two channel regions and the intermediate region through a gate insulating film 13 interposed therebetween. An entire portion of the intermediate electrode 18m that is located between the first channel region 14c1 and the second channel region 14c2 overlaps the gate electrode 12 through the intermediate region 14m and the gate insulating film 13.

20 Claims, 8 Drawing Sheets (a)

THIN FILM TRANSISTOR WITH RECESS

TECHNICAL FIELD

The present invention relates to a semiconductor device, and in particular, to a semiconductor devices having a semiconductor layer supported on a substrate.

BACKGROUND ART

Liquid crystal display devices and organic EL display devices, which include a thin film transistor (TFT) for each pixel, have been in wide use in recent years. TFTs are manufactured using a semiconductor layer formed on a substrate, such as a glass substrate. A substrate on which the TFTs have been formed is called an active matrix substrate.

As such TFTs, TFTs with an amorphous silicon film as the active layer (amorphous silicon TFTs) and TFTs with a polysilicon film as the active layer (polysilicon TFTs) have been widely used.

Because the carrier mobility in a polysilicon film is higher than in an amorphous silicon film, polysilicon TFTs offer higher ON currents and operate faster than amorphous silicon TFTs. For this reason, display panels having polysilicon TFTs not only for the pixels, but also for part or all of peripheral circuits, such as a driver, are under development.

Manufacturing of the polysilicon TFTs, however, requires complicated steps, including a laser crystallization step for crystallizing an amorphous silicon film, a thermal anneal step, and an ion doping step, which contribute to higher manufacturing cost per substrate unit area. For this reason, polysilicon TFTs are mainly used today for mid- to small-sized display devices, and amorphous silicon TFTs are used for large display devices.

As larger display devices have become available in recent years, amidst increasing demand for higher image quality and lower power consumption, TFTs with a microcrystalline silicon ($\mu$c-Si) film as the active layer, which offer higher performance and lower manufacturing cost than the amorphous silicon TFTs, have been proposed (Patent Document 1, Patent Document 2, and Non-Patent Document 1). Such TFTs are called microcrystalline silicon TFTs.

A microcrystalline silicon film is a silicon film having crystal and amorphous phases, and is constructed of microcrystalline grains spread throughout an amorphous matrix. The size of each microcrystalline grain (several hundred nanometers or less) is smaller than the size of crystal grains in a polysilicon film. The microcrystalline grains may be columnar crystals.

A microcrystalline silicon film may be formed, for example, using a plasma CVD method, and does not require an anneal process for crystallization. Thus, it can be formed using a conventional manufacturing facility for amorphous silicon films. Furthermore, because a microcrystalline silicon film offers a higher carrier mobility than an amorphous silicon film, a microcrystalline silicon TFT offers higher performance than an amorphous silicon TFT.

For example, Patent Document 1 describes that use of a microcrystalline silicon film as the TFT active layer would yield ON currents that are 50% higher than that of the amorphous silicon TFTs. Furthermore, Non-Patent Document 1 describes that use of a semiconductor film made of microcrystalline silicon and amorphous silicon yields TFTs having an on/off current ratio of $10^6$, a mobility of about 1 cm$^2$/Vs, and a threshold voltage of about 5 volt.

Furthermore, Patent Document 2 discloses an inverse staggered TFT made of microcrystalline silicon.

In spite of offering many advantages described above, microcrystalline silicon TFTs have yet to be commercialized to date. One of the reasons is that microcrystalline silicon TFTs have high OFF currents (leakage currents).

A possible approach to reducing the TFT OFF current is to introduce a multi-gate structure already in use for polysilicon TFTs. For example, Patent Documents 3 and 4 disclose liquid crystal display devices and organic EL display devices using microcrystalline silicon TFTs having multi-gate structures.

PRIOR ART DOCUMENTS

Patent Documents

Patent Document 1: Japanese Patent Application Laid-Open Publication No. H6-196701
Patent Document 2: Japanese Patent Application Laid-Open Publication No. H5-304171
Patent Document 3: Japanese Patent Application Laid-Open Publication No. 2005-51211
Patent Document 4: Japanese Patent Application Laid-Open Publication No. 2005-49832

Non-Patent Documents

Non-Patent Document 1: Zhongyang Xu et al, "A Novel Thin-film Transistor with $\mu$c-Si/a-Si Dual Active Layer Structure for AM-LCD," IDW 96 Proceedings of the Third International Display Workshops, Volume 1, 1996, pages 117-120.

SUMMARY OF THE INVENTION

Problems to be Solved by the Invention

However, based on the present inventors' investigation, it is concluded that TFTs with a multigate structure described in Patent Documents 3 and 4 would not be able to achieve low enough OFF currents, as will be explained below with reference to specific comparison examples.

The present invention seeks to address the problems described above. A main object of the present invention is to provide semiconductor devices that can offer lower OFF currents than the conventional art.

Means for Solving the Problems

A semiconductor device of the present invention includes an active layer supported by a substrate, the active layer having at least two channel regions, a source region, a drain region, and at least one intermediate region formed between the at least two channel regions; a contact layer having a source contact region in contact with the source region, a drain contact region in contact with the drain region, and at least one intermediate contact region in contact with the at least one intermediate region; a source electrode in contact with the source contact region; a drain electrode in contact with the drain contact region; at least one intermediate electrode in contact with the at least one intermediate contact region; and a gate electrode facing the at least two channel regions and the at least one intermediate region through a gate insulating film interposed therebetween, wherein the at least two channel regions include a first channel region formed between the source region and the at least one intermediate region and a second channel region formed between the drain region and the at least one intermediate region, and wherein an entire portion of the at least one intermediate electrode that is located between the first channel region and the second channel region overlaps the gate electrode through the at least one intermediate region and the gate insulating film.

In one preferred embodiment, the gate electrode further includes portions that overlap the source region and the drain region, and the size of the portion of the gate electrode that overlaps the drain region is smaller than the size of the portion of the gate electrode that overlaps the source region.

In another preferred embodiment, the intermediate electrode has a recess, and the drain electrode has a portion that protrudes into the recess of the intermediate electrode, as viewed from a direction perpendicular to the substrate.

In another preferred embodiment, the source electrode has a recess, and the at least one intermediate electrode has a portion that protrudes into the recess of the source electrode, as viewed from a direction perpendicular to the substrate.

In another preferred embodiment, the at least one intermediate region includes a first intermediate region and a second intermediate region, the at least one intermediate contact region includes a first intermediate contact region and a second intermediate contact region, and the at least one intermediate electrode includes a first intermediate electrode and a second intermediate electrode, and wherein the at least two channel regions further includes a third channel region, the first channel region is formed between the source electrode and the first intermediate electrode, the second channel region is formed between the drain electrode and the second intermediate electrode, and the third channel region is formed between the first intermediate electrode and the second intermediate electrode.

In another preferred embodiment, the active layer includes a microcrystalline semiconductor layer having crystal grains and an amorphous phase. The active layer includes a microcrystalline silicon film as the microcrystalline semiconductor film.

In another preferred embodiment, the gate electrode is formed between the active layer and the substrate.

In another preferred embodiment, the active layer is formed between the gate electrode and the substrate.

In another preferred embodiment, the at least one intermediate contact region is also the at least one intermediate electrode.

That is, a semiconductor device according to another preferred embodiment includes an active layer supported by a substrate, the active layer having at least two channel regions, a source region, a drain region, and at least one intermediate region formed between the at least two channel regions; a contact layer having a source contact region in contact with the source region, a drain contact region in contact with the drain region, and at least one intermediate contact region in contact with the at least one intermediate region; a source electrode in contact with the source contact region; a drain electrode in contact with the drain contact region; a gate electrode facing the at least two channel regions and the at least one intermediate region through a gate insulating film interposed therebetween, wherein the at least two channel regions include a first channel region formed between the source region and the at least one intermediate region and a second channel region formed between the drain region and the at least one intermediate region, and wherein an entire portion of the at least one intermediate contact region that is located between the first channel region and the second channel region overlaps the gate electrode through the at least one intermediate region and the gate insulating film.

In another preferred embodiment, the active layer is formed between the gate electrode and the substrate.

An active matrix substrate according to the present invention includes any one of the semiconductor devices described above.

A display apparatus of according to the present invention includes any one of the semiconductor devices described above.

Effect of the Invention

The present invention provides a semiconductor device capable of offering OFF currents that are lower than in the conventional art. While the present invention is particularly effective for reducing the OFF currents of TFTs having an active layer including a microcrystalline silicon film, the prevent invention can reduce the OFF currents of TFTs regardless of type of semiconductor film.

DETAILED DESCRIPTION OF EMBODIMENTS

Preferred embodiments of semiconductor devices of the present invention are described with reference to the drawings. While examples of TFTs having a microcrystalline silicon film as an active layer are described, the present invention is not limited to such examples.

Figure 1:
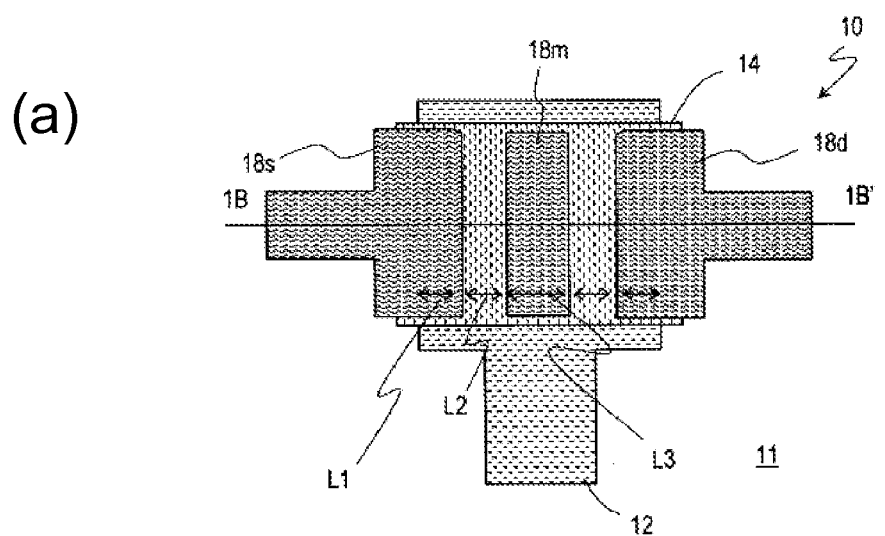
FIG. 1(a) is a schematic plan view of a TFT 10 according to a preferred embodiment of the present invention.
FIG. 1(b) is a schematic cross-sectional view along the line 1B-1B' in FIG. 1(a).
FIG. 1(c) shows an equivalent circuit diagram for TFT 10.
Figure 1:
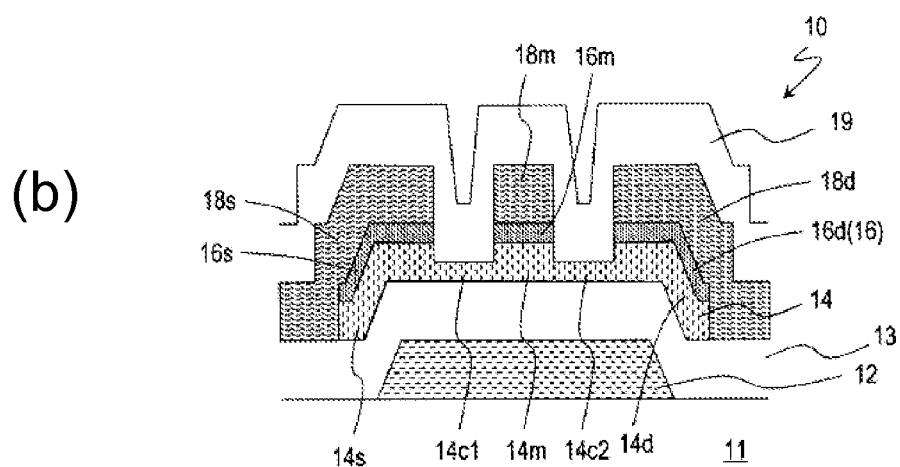
Figure 1:
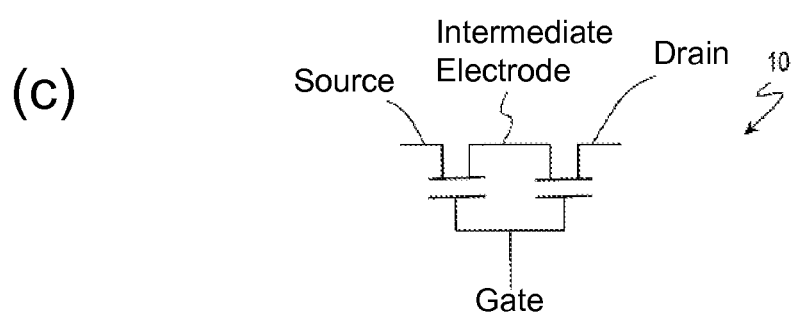

FIG. 1 shows a schematic of TFT 10 according to a preferred embodiment of the present invention. FIG. 1(a) is a schematic plan view of TFT 10; FIG. 1(b) is a cross-sectional schematic along the line 1B-1B' in FIG. 1(a); and FIG. 1(c) shows an equivalent circuit diagram for TFT 10.

TFT 10 has a dual gate structure and is electrically equivalent to a structure having two TFTs that are connected in series, as shown in the equivalent circuit diagram in FIG. 1(c).

TFT 10 includes an active layer 14, which is supported by a substrate 11 (for example, a glass substrate). Active layer 14 is a semiconductor layer and includes a microcrystalline silicon film. Active layer 14 includes channel regions 14$c$1 and 14$c$2; a source region 14$s$; a drain region 14$d$; and an intermediate region 14$m$, which is formed between two channel regions 14$c$1 and 14$c$2. However, the preferred embodiment is not limited to the example described here, which has one intermediate region 14$m$ and two channel regions 14$c$1 and 14$c$2, and may include two or more intermediate regions and three or more channel regions.

Furthermore, TFT 10 includes a contact layer 16 that includes a source contact region 16$s$, which is in contact with source region 14$s$, a drain contact region 16$d$, which is in contact with the drain region 14$d$, and an intermediate contact region 16$m$, which is in contact with intermediate region 14$m$. TFT 10 further includes a source electrode 18$s$, which is in contact with source contact region 16$s$, a drain electrode 18$d$, which is in contact with drain contact region 16$d$, and an intermediate electrode 18$m$, which is in contact with intermediate contact region 16$m$. TFT 10 further includes a gate electrode 12 facing two channel regions 14$c$1 and 14$c$2 and intermediate region 14$m$ through a gate insulating film 13 interposed therebetween. The intermediate electrode 18$m$ is a so-called floating electrode, which has no electrical contact. Furthermore, TFT 10 includes a protective film 19 that covers all of these elements.

The first channel region 14$c$1 is formed between the source region 14$s$ and the intermediate region 14$m$, and the second channel region 14$c$2 is formed between the drain region 14$d$ and the intermediate region 14$m$. Furthermore, the two channel regions 14$c$1 and 14$c$2, the source region 14$s$, the drain region 14$d$, and the intermediate region 14$m$ are all formed in a single continuous active layer 14. Furthermore, the entire portion of intermediate electrode 18$m$ that is located between the first channel region 14$c$1 and the second channel region 14$c$2 overlaps the gate electrode 12 through the intermediate region 14$m$ and the gate insulating film 13 interposed therebetween.

In this example, the entire intermediate electrode 18$m$ overlaps the gate electrode 12 through the intermediate region 14$m$ and the gate insulating film 13. But the present invention is not limited to this particular configuration. For example, when intermediate electrode 18$m$ extends beyond a region between the first channel region 14$c$1 and the second channel region 14$c$2, which are positioned on both sides of intermediate electrode 18$m$, by extending itself upward and downward in FIG. 1(a), for example, portions of intermediate electrode 18$m$ that are outside of the region between the first channel region 14$c$1 and the second channel region 14$c$2 need not overlap the gate electrode 12 through the intermediate region 14$m$ and the gate insulating film 13 interposed therebetween.

TFT 10 differs from the TFTs described in Patent Documents 3 and 4 (TFT 90 shown in FIG. 2 as an example for comparison) in that the entire portion of intermediate electrode 18$m$ that is located between first channel region 14$c$1 and second channel region 14$c$2 overlaps gate electrode 12 through the intermediate region 14$m$ and the gate insulating film 13 interposed therebetween, and therefore, TFT 10 offers various advantages, such as reduced OFF currents.

Here, TFT 10 is a bottom gate (inverse staggered) device having gate electrode 12 formed between active layer 14 and substrate 11, and is a channel etch type device having channels 14$c$1 and 14$c$2 formed in etched regions of the active layer 14, as shown in the cross-sectional structure in FIG. 1(b).

Active layer 14 of TFT 10 is formed of a microcrystalline silicon film or a multi-layer film of a microcrystalline silicon film and an amorphous silicon film, and may be manufactured using a manufacturing process for the conventional amorphous silicon TFTs. The microcrystalline silicon film can be deposited using a plasma CVD method, similar to the manufacturing method used for an amorphous silicon film, using a silane gas diluted with hydrogen gas as a source gas.

The microcrystalline silicon film will be described in detail next.

The microcrystalline silicon film has a mixed structure of crystalline silicon phase and amorphous silicon phase. The volume percentage of the amorphous phase in the microcrystalline silicon film can be controlled within a range of, for example, 5% or greater and 95% or less. The volume percentage of the amorphous phase should preferably be 5% or greater and 40% or less for more effectively improving the TFT on-off current ratio. A Raman scattering spectrum analysis of the microcrystalline silicon film using the visible light results in a spectrum having the highest peak at 520 cm$^{-1}$ wavelength, corresponding to the peak for crystalline silicon, and a broad peak at 480 cm$^{-1}$ wavelength, corresponding to amorphous silicon. The height of the amorphous silicon peak at around 480 cm$^{-1}$ is, for example, 1/30 or greater and 1 or less of the height of the crystalline silicon peak at around 520 cm$^{-1}$.

A Raman spectroscopy analysis on a polysilicon film, conducted for comparison, reveals almost no amorphous component with the height of the amorphous silicon peak being almost zero. A polysilicon film may have localized regions of amorphous phase under some crystallization conditions. Even in such instances, the volume percentage of the amorphous phase in the polysilicon film is typically less than 5%, and the height of the amorphous silicon peak is typically 1/30 or less of the height of the polysilicon peak in a Raman scattering spectrum analysis.

A microcrystalline silicon film includes both crystal grains and amorphous phase. Sometimes, a thin amorphous layer (called incubation layer) may form on the substrate side of the microcrystalline silicon film. The incubation layer is, for example, several nanometers in thickness, depending on the microcrystalline silicon film deposition conditions. The incubation layer is almost nonexistent with certain deposition methods and deposition conditions for the microcrystalline silicon film, especially when a high density plasma CVD method is used, for example.

The size of crystal grains contained in the microcrystalline silicon film is in general smaller than the crystal grains that make up a polysilicon film. An analysis on a cross-section of a microcrystalline silicon film using a transmission electron microscope (TEM) has revealed that the crystal grains average in grain sizes that are 2 nm or larger and 300 nm or smaller. Sometimes, the crystal grains grow in columns which span from the incubation layer to the top surface of the polycrystalline silicon film. A high-qualify microcrystalline silicon film with few defects results, when the crystal grain diameter is about 10 nm and the overall volume percentage of the crystal grains in the microcrystalline silicon film is 60% or more and 85% or less.

Because microcrystalline silicon contains crystal grains, the carrier mobility is higher than that of amorphous silicon;

however, the band gap is smaller and microcrystalline silicon is susceptible to defects formed in the film, as compared with amorphous silicon. Thus, microcrystalline silicon TFTs tend to have a problem of larger off currents. TFT 10 of the preferred embodiment of the present invention achieves smaller TFT OFF currents as a result of a novel multigate structure.

Figure 2:
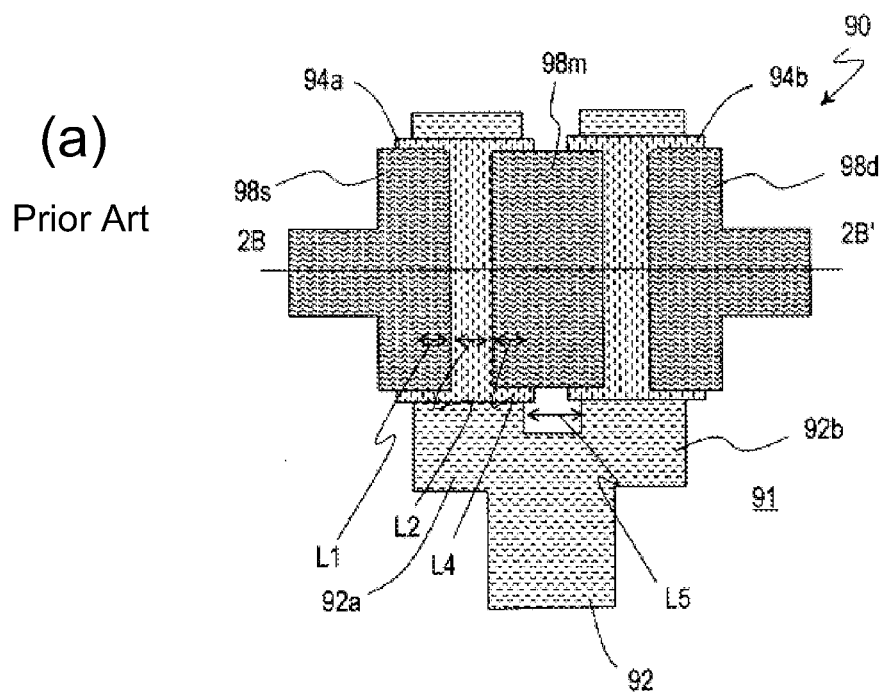
FIG. 2(a) is a schematic plan view of a TFT 90, having a conventional double gate structure.
FIG. 2(b) is a schematic cross-sectional view along the line 2B-2B' in FIG. 2(a).
Figure 2:
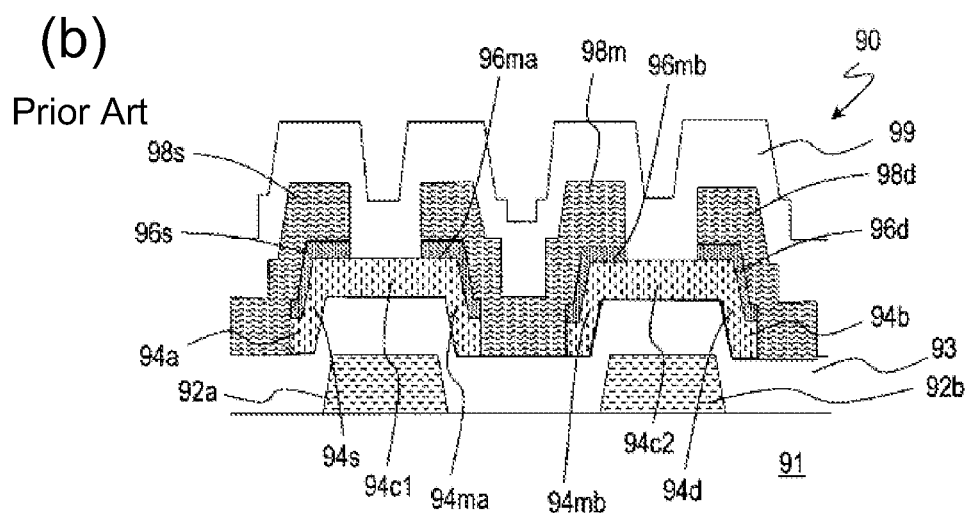

The structure of TFT 90, presented as an example for comparison, will be described next with reference to FIG. 2. FIG. 2 is a schematic of TFT 90, having the double gate structure described in Patent Documents 3 and 4. FIG. 2(a) is a plan view schematic, and FIG. 2(b) is a cross-sectional schematic along line 2B-2B' in FIG. 2(a).

TFT 90 includes a gate electrode 92, which is split into two branches: gate branches 92a and 92b. Active layers 94a and 94b, which correspond with gate branches 92a and 92b, respectively, through a gate insulating film 93 covering the gate electrode 92, are formed separately. A source region 94s, a first channel region 94c1, and a first intermediate region 94ma are formed in active layer 94a; and a drain region 94d, a second channel region 94c2, and a second intermediate region 94mb are formed in active layer 94b. A source electrode 98s is formed to face source region 94s through a source contact layer 96s, and a drain electrode 98d is formed to face drain region 94d through a drain contact layer 96d. TFT 90 furthermore includes a protective film 99, which covers these elements.

An intermediate electrode 98m of TFT 90 is formed to face intermediate region 94ma through an intermediate contact layer 96ma as well as to face intermediate region 94mb through an intermediate contact layer 96mb. The intermediate electrode 98m is formed in such a way as to span a gap between two active layers 94a and 94b as well as to span a gap between two gate branches 92a and 92b. There exists a portion of the intermediate electrode 98m between the first channel region 94c1 and the second channel region 94c2 that does not overlap active layers 94a or 94b or gate electrode 92.

Although the equivalent circuit for TFT 90 is the same as the equivalent circuit for TFT 10, as shown in FIG. 1(c), TFT 10 has the following advantages over TFT 90 because of the structural differences in the intermediate electrodes and the active layers.

First, TFT 10 achieves a lower OFF current than TFT 90 for the reasons described next.

As shown in FIGS. 2(a) and 2(b), in TFT 90, the intermediate electrode 98m is electrically connected to active layers 94a and 94b only at the two ends of intermediate electrode 98m through intermediate contact layers 96ma and 96mb. Therefore, in TFT 90, one end (on the side of intermediate contact layer 96ma) of the intermediate electrode 98m functions as a drain electrode with respect to source electrode 98s, while the other end (on the side of intermediate contact layer 96mb) of the intermediate electrode 98m functions as a source electrode with respect to drain electrode 98d. As a result, the intermediate electrode 98m has concentrations of electric fields at both ends.

In TFT 10, on the other hand, as shown in FIGS. 1(a) and 1(b), the entire intermediate electrode 18m is electrically connected to active layer 14 through intermediate contact layer 16m. As a result, the entire intermediate electrode 18m functions as a drain electrode with respect to source electrode 18s and as a source electrode with respect to drain electrode 18d. Accordingly, the electric field in intermediate electrode 18m of TFT 10 is less concentrated than the electric fields at both ends of intermediate electrode 98m of TFT 90. As a result, TFT 10 offers smaller OFF currents and higher reliability than TFT 90.

Figure 3:
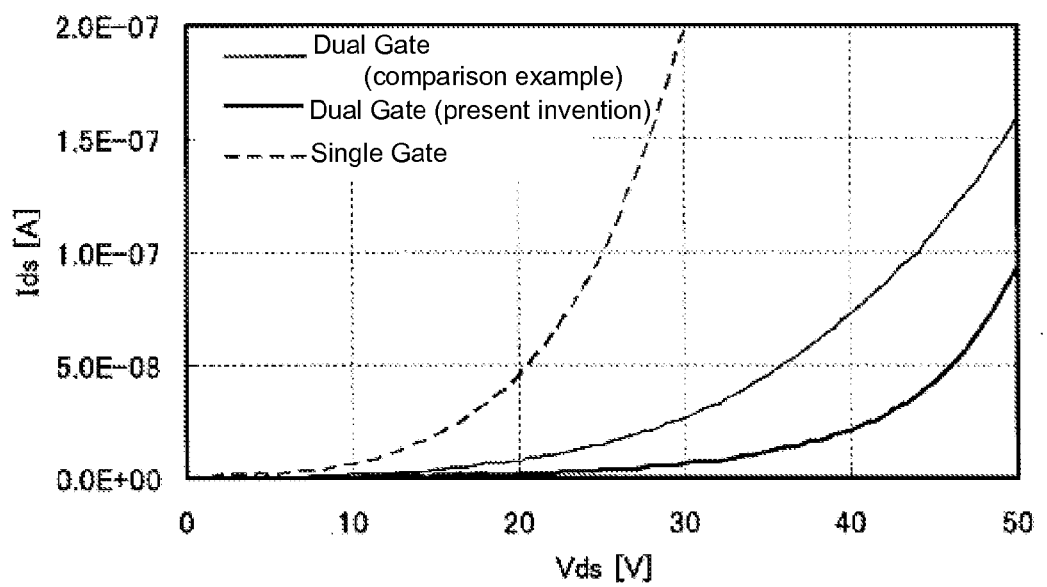
FIG. 3 shows a graph providing examples of OFF current characteristics of TFT 10 and TFT 90.

FIG. 3 shows examples of the OFF current characteristics of TFT 10 and TFT 90. Also shown in FIG. 3 is the OFF current characteristics of a TFT having a single gate structure. The horizontal axis in FIG. 3 represents the source-drain voltage Vds (V), and the vertical axis represents the source-drain current Ids (A). The gate voltage is 0 V, and Ids is the OFF current. The semiconductor layers in TFT 10 and TFT 90 are microcrystalline silicon films deposited by a high density PECVD method. The degree of crystallinity of these microcrystalline silicon films is about 70% according to Raman measurements, and the grain size is about 5 nm to about 10 nm. The TFT channel length (L) and channel width (W) are L/W=4 μm/100 μm, respectively.

As shown in FIG. 3, the TFT having the conventional dual gate structure (comparison example) has lower OFF currents than the TFT with the single gate structure, while the TFT having the novel dual gate structure according to the present invention has even lower OFF currents. Because the concentration of electric fields in the intermediate electrode is alleviated with the dual gate structure of the present invention, the OFF currents can be effectively reduced especially when a large electric field is applied.

Figure 4:
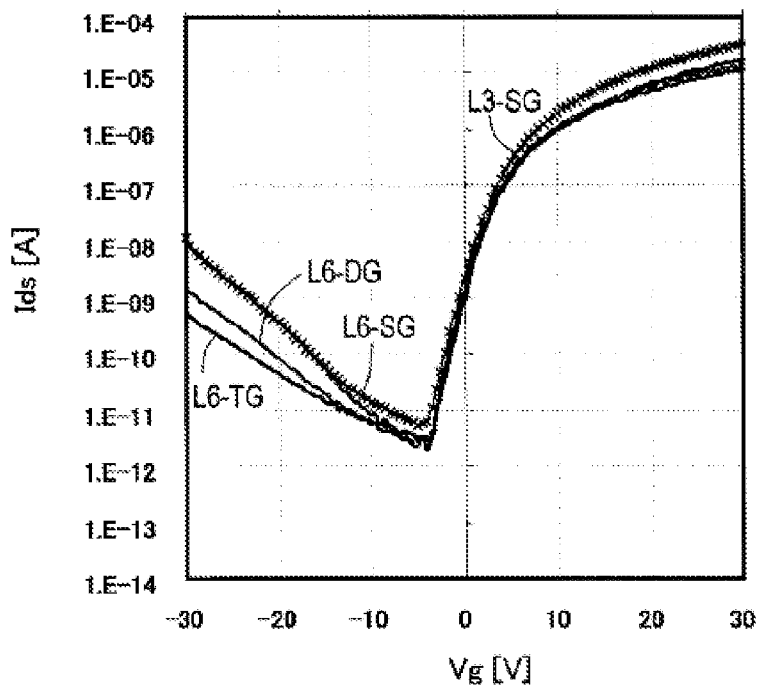
FIG. 4 is a graph showing a relationship between a gate voltage Vg (V) and source-drain current Ids (A) of TFTs having a single gate structure, a dual gate structure, and a triple gate structure.

Next, relationships between the gate voltage Vg (V) and the source-drain currents Ids (A) for the TFTs with the single gate, dual gate, and triple gate structures will be explained with references to FIG. 4. The horizontal axis in FIG. 4 represents the gate voltage Vg (V) and the vertical axis represents the source-drain current Ids (A). The source-drain voltage Vds is 10 V.

The dual gate structure here is similar to the structure of TFT 10 in FIG. 1; the single gate structure is the structure of TFT 10 without intermediate electrode 18m; and the triple gate structure is a structure in which two of the intermediate electrode 18m of TFT 10 are disposed in parallel. The channel length is 6 μm for all. In other words, the single gate structure has one channel with a channel length of 6 μm (L6-SG); the dual gate structure has two channels, each having a channel length of 3 μm (L6-DG); and the triple gate structure has three channels, each having a channel length of 2 μm (L6-TG). FIG. 4 also shows the results for a single gate structure with a 3 μm long channel (L3-SG).

Results for the single gate structures in FIG. 4 show no differences in the OFF currents between the channel lengths of 6 μm (L6-SG) and 3 μm. In other words, there is no correlation between the magnitude of OFF currents and the channel length, indicating that the OFF currents are mainly determined by leakage currents in the drain.

As shown in FIG. 4, the OFF currents can be lowered by adopting the dual gate structure and the triple gate structure. Furthermore, the triple gate structure is more effective at reducing the OFF currents than the dual gate structure.

Table 1 below shows the source-drain OFF current values, when the gate voltage is 0 V and the source-drain voltage Vds is 40 V and when the gate voltage is −29 V and the source-drain voltage Vds is 10 V.

TABLE 1

| | OFF currents (A) | | |
|---|---|---|---|
| Vg/Vds | Single gate | Dual gate | Triple gate |
| 0 V/40 V | $3.0 \times E{-}09$ | $1.9 \times E{-}10$ | $6.0 \times E{-}11$ |
| −29 V/10 V | $6.6 \times E{-}09$ | $1.0 \times E{-}09$ | $3.9 \times E{-}10$ |

As can be understood from the results in Table 1, when Vds is 40 V, by adopting the dual gate or triple gate structure, the OFF current at a gate voltage Vg of 0 V can be made one to two orders of magnitude lower than that of the single gate structure. On the other hand, when Vds is 10 V, by adopting the dual gate or triple gate structure, the OFF current at a gate voltage Vg of −29 V can be made approximately one order of magnitude lower that that of the single gate structure.

As described above, the multi-channel structures of the present invention can effectively reduce the TFT OFF currents.

Furthermore, the multi-channel structures of the present invention offer another advantage in that the size of the TFTs can be reduced, as compared with the TFTs having the conventional multi-channel structure.

Turning to FIG. 1(a) and FIG. 2(a). Comparison between FIGS. 1(a) and 2(a) shows that TFT 10 is shorter along the direction of the channel than TFT 90.

The length of TFT 10 along the channel (from source electrode 18s to drain electrode 18d) is determined by 2L1+2L2+L3, as shown in FIG. 1(a). L1 is the length of an area over which source electrode 18s overlaps gate electrode 12 through the active layer 14 interposed therebetween, or the length of an area over which drain electrode 18d overlaps gate electrode 12, through the active layer 14 interposed therebetween. L2 is the length of channel regions 14c1 and 14c2, respectively. L3 is the length of intermediate electrode 18m. For example, when L1=3 μm, L2=4 μm, and L3=4 μm, the length of TFT 10 along the channel is 2L1+2L2+L3=18 μm.

In contrast, the length of TFT 90 along the channel direction (from source electrode 98s to drain electrode 98d) is determined by 2L1+2L2+2L4+L5, as shown in FIG. 2(a). L1 is the length of an area over which source electrode 98s overlaps gate branch 92a through active layer 94a interposed therebetween, or the length of an area over which drain electrode 98d overlaps gate branch 92b through active layer 94b interposed therebetween. L2 is the length of channel regions 94c1 and 94c2, respectively. L4 is the length of an area over which intermediate electrode 98m overlaps gate branch 92a through active layer 94a interposed therebetween, or the length of an area over which intermediate electrode 98m overlaps gate branch 92b through active layer 94b interposed therebetween. For example, when L1=3 μm, L=4 μm, L4=3 μm, and L5=5 μm, the length of TFT 90 along the channel is 2L1+2L2+2L4+L5=25 μm.

Accordingly, the novel dual gate structure of the present invention can make the TFTs smaller.

Next, a method of manufacturing active matrix substrate 100 having TFT 10 will be described with reference to FIGS. 5(a) through 5(f). Active matrix substrate 100, provided here as an example, is used for liquid crystal display devices.

As shown in FIG. 1(a), a gate electrode 12 is formed on a glass substrate 11. The gate electrode 12 is formed by patterning a Ti/Al/Ti multi-layer film (with a thickness of, for example, 0.2 μm), for example. At the same time, the same conductive film used for gate electrode 12 may also be used for forming gate bus lines and CS bus lines (neither of which are shown in the figures).

Figure 5:
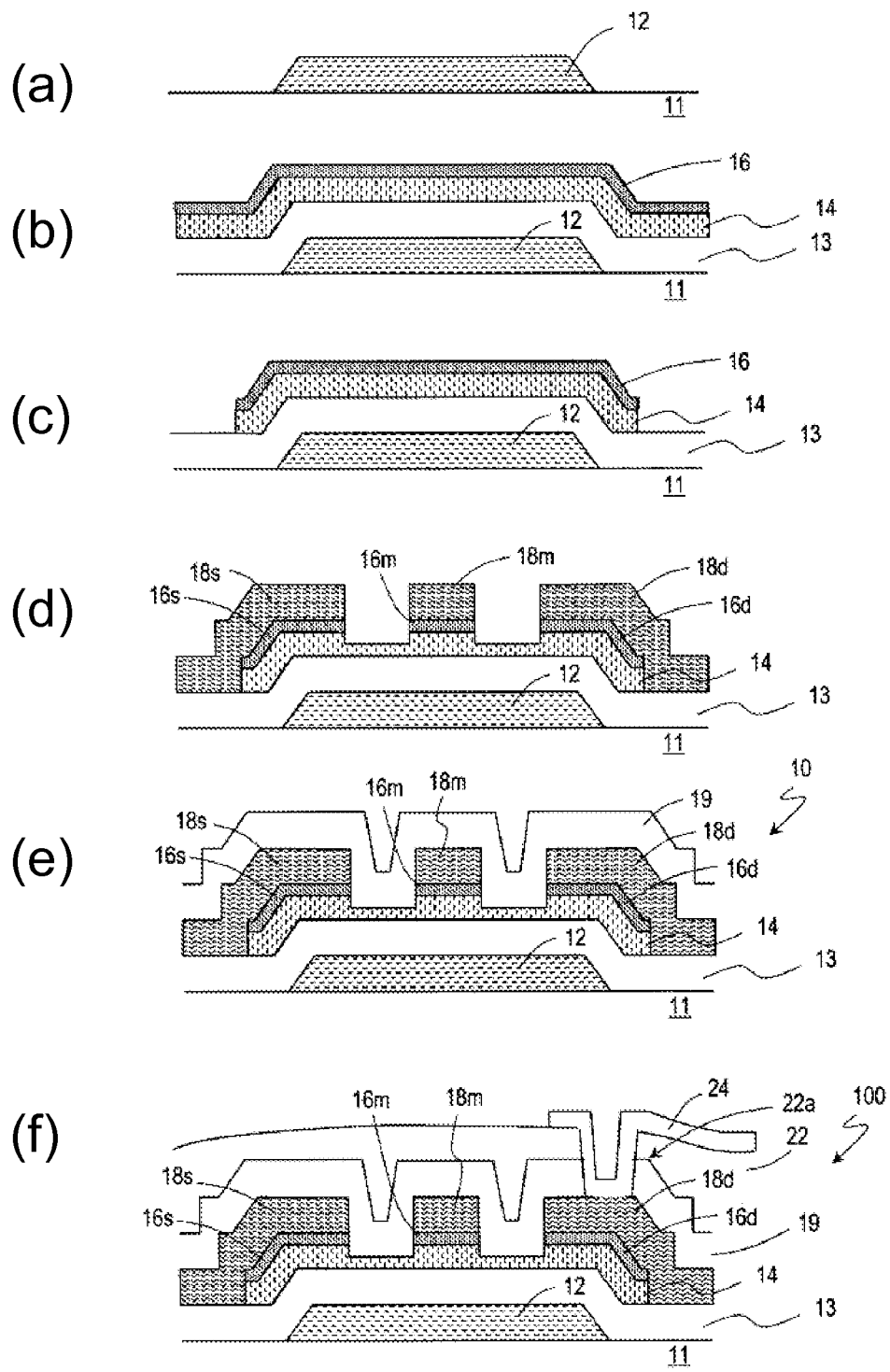
FIGS. 5(a) through 5(f) are schematic cross-sectional views showing a method of manufacturing an active matrix substrate 100, which includes TFT 10.

Next, as shown in FIG. 5(b), a gate insulating film 13, a microcrystalline silicon film 14, and an N⁺ silicon film 16 are deposited continuously in that order. The gate insulating film 13 may be formed by depositing, for example, an SiNx film (having, for example, a thickness of 0.4 μm) using a parallel-plate plasma CVD method. The microcrystalline silicon film 14 (having a thickness, for example, of 0.12 μm) is formed by a high-density plasma CVD method. The N⁺ silicon film 16 (having, for example, a thickness of 0.05 μm) is formed by a high-density plasma CVD method or a parallel-plate plasma CVD method.

The SiNx film 13 is deposited by, for example, using a deposition chamber having a parallel-plate (capacitive coupling) electrode structure under the conditions of a substrate temperature of 300° C., a pressure of 50 to 300 Pa, and a power density of 10 to 20 mW/cm². Furthermore, the film formation gas used for the deposition is a mixture of silane (SiH₄), ammonia (NH₃) and nitrogen (N₂).

Microcrystalline silicon film 14 is deposited by ICP high-density PECVD with a substrate temperature of 250 to 350° C., a pressure of 0.5 to 5 Pa, and a power density of 100 to 200 mW/cm². The film formation gas used for the deposition is a silane gas diluted with a hydrogen gas. The flow rate ratio for silane (SiH₄) and hydrogen (H₂) is 1:1 to 1:10.

The N⁺ silicon film 16 is deposited using a deposition chamber having a parallel plate (capacitive coupling) electrode structure with a substrate temperature of 250 to 300° C., a pressure of 50 to 300 Pa, and a power density of 10 to 20 mW/cm². The film formation gas used for the deposition is a mixture of silane (SiH₄), hydrogen (H₂), and phosphine (PH₃).

Then, as shown in FIG. 5(c), the microcrystalline silicon film 14 and the N⁺ silicon film 16 are patterned to create active layer 14 and contact layer 16.

Next, as shown in FIG. 5(d), a metal film (a so called source metal) is deposited to cover the contact layer 16 and is then patterned to form a source electrode 18s, a drain electrode 18d, and an intermediate electrode 18m. The metal film may be an Al/Mo multi-layer film. An Al/Mo film may be patterned using the SLA etchant (H₃PO₄:H₂O:HNO₃:CH₃COOH=16:2:1:1), which is a widely used metal etchant.

A mask (for example, a photoresist layer) used for etching the metal film is used for dry etching and isolating the contact layer (N⁺ silicon layer) 16 into a source contact region 16s, drain contact region 16d, and intermediate contact region 16m. At the same time, a portion of active layer 14 (microcrystalline silicon film) is also etched (channel etch). The thickness of remaining active layer 14 is about 40 nm.

Next, as shown in FIG. 5(e), a protective film 19 is formed. The protective film 19 may be an SiNx film deposited by plasma CVD, for example. This completes TFT 10.

Then, as shown in FIG. 5(f), a planarization film 22 is formed. The planarization film 22 may be formed using an organic resin film, for example. A contact hole 22a is formed in the planarization film 22 and the protective film 19. Then, a transparent conductive film (for example, an ITO film) is deposited and patterned to form a pixel electrode 24. The pixel electrode 24 is in contact with drain electrode 18d inside the contact hole 22a.

As a result, active matrix substrate 100 having TFT 10 in contact with pixel electrode 24 is obtained.

Next, structures of other TFTs according to preferred embodiments of the present invention will be described with reference to FIG. 6 and FIG. 7.

FIG. 6(a) is a plan view schematic of TFT 10A, and FIG. 6(b) is a plan view schematic of TFT 10B. Cross-sectional structures of TFT 10A and TFT 10B are the same as the cross-sectional structure of TFT 10 of FIG. 1(b), and therefore, are not shown.

TFT 10A of FIG. 6(a) has a dual gate structure similar to TFT 10 of FIG. 1. TFT 10A has a gate electrode 12, an active layer 14, a source electrode 18sa, a drain electrode 18da, and an intermediate electrode 18ma, formed on a substrate (not shown in the figure). A contact layer (not shown in the figure) is formed between active layer 14 and electrodes 18sa, 18da, and 18ma, respectively. A source region is an area over which active layer 14 overlaps source electrode 18sa through the contact layer; a drain region is an area over which active layer 14 overlaps drain electrode 18*da* through the contact layer; and an intermediate region is an area over which active layer 14 overlaps intermediate electrode 18*ma* through the contact layer. When the substrate surface is viewed from the direction perpendicular to the substrate, the source region has the same shape as source electrode 18*sa*, the drain region has the same shape as drain electrode 18*da*, and the intermediate region has the same shape as intermediate electrode 18*ma*.

In TFT 10A, the size of an area over which gate electrode 12 overlaps the drain region is smaller than the size of an area over which gate electrode 12 overlaps the source region.

Figure 6:
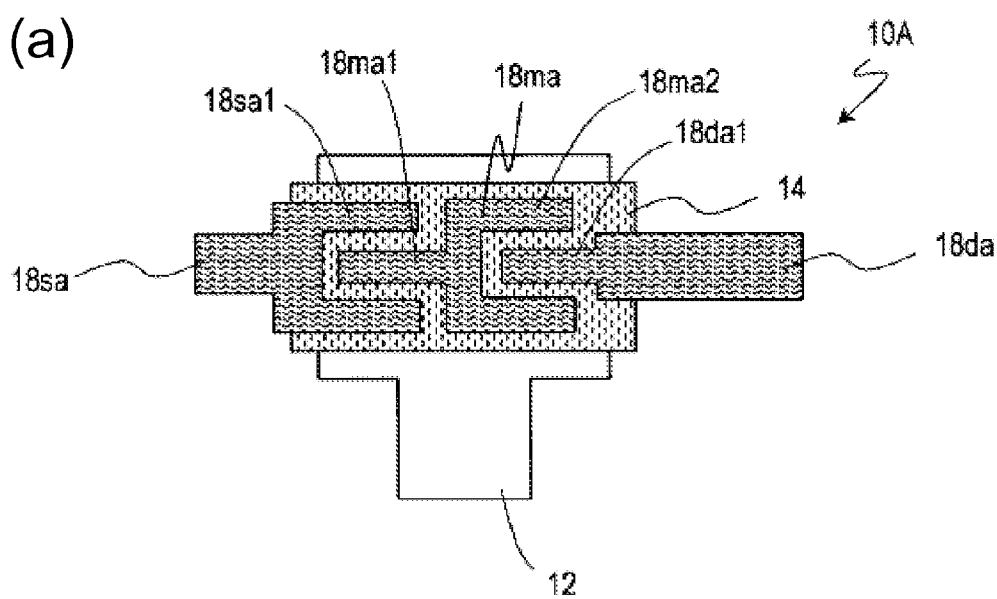
FIG. 6(a) is a plan view schematic of a TFT 10A according to a preferred embodiment of the present invention.
FIG. 6(b) is a plan view schematic of a TFT 10B according to a preferred embodiment of the present invention.
Figure 6:
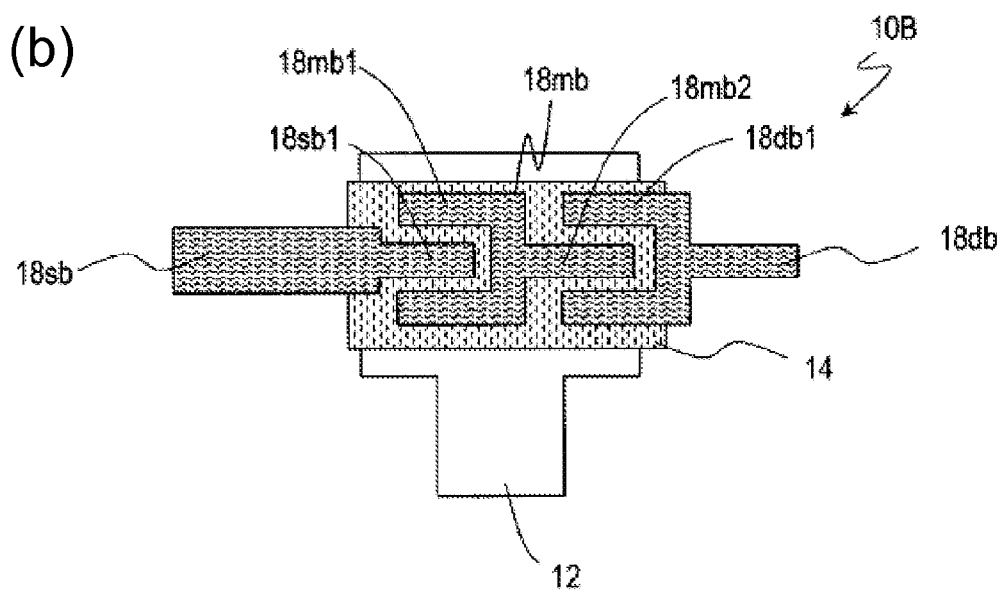

As shown in FIG. 6(*a*), the intermediate electrode 18*ma* has a recess 18*ma*2, and the drain electrode 18*da* has a part 18*da*1 protruding into the recess 18*ma*2 of the intermediate electrode 18*ma*. The potion of the drain electrode 18*da* that overlaps gate electrode 12 through active layer 14 (which is the drain region) is part 18*da*1, which narrowly protrudes out of the main part (drain electrode 18*da*). As is clear from comparison with the drain electrode 18*d* of TFT 10 in FIG. 1(*a*), the area of the portion of drain electrode 18*da* that overlaps the gate electrode 12 through the active layer 14 is smaller in TFT 10A.

Furthermore, in TFT 10A of FIG. 6(*a*) the source electrode 18*sa* has a recess 18*sa*1, and the intermediate electrode 18*ma* has a part 18*ma*1 protruding into recess 18*sa*1 of the source electrode 18*sa*. As is clear from comparison with the source electrode 18*s* of TFT 10 in FIG. 1(*a*), the area of the portion of source electrode 18*sa* that overlaps the gate electrode 12 through active layer 14 is larger in TFT 10A.

Accordingly, in TFT 10A of FIG. 6(*a*), because the drain electrode 18*da*, the intermediate electrode 18*ma*, and the source electrode 18*sa* have the shapes described above, the size of the area over which the gate electrode 12 overlaps the drain region is smaller than the size of the area over which the gate electrode 12 overlaps the source region, Here, even if the structure on the left side of the intermediate electrode 18*ma* of TFT 10A in FIG. 6(*a*) were modified to be the same as the structure on the left side of the intermediate electrode 18*m* of TFT 10 in FIG. 1(*a*), the size of an area over which gate electrode 12 overlaps drain electrode 18*da* through the active layer 14 would be smaller than the size of an area over which gate electrode 12 overlaps source electrode 18*s* (see FIG. 1(*a*)) through active layer 14.

Furthermore, even if the structure on the right side of the intermediate electrode 18*ma* of TFT 10A in FIG. 6(*a*) were modified to be the same as the right side structure of intermediate electrode 18*m* of TFT 10 in FIG. 1(*a*), the size of an area over which gate electrode 12 overlaps drain electrode 18*d* through the active layer 14 (see FIG. 1(*a*)) would be smaller than the size of an area over which gate electrode 12 overlaps source electrode 18*sa* through the active layer 14.

Thus, a combination of either right side or left side of intermediate electrode 18*ma* of TFT 10A in FIG. 6(*a*) with TFT 10 in FIG. 1(*a*) will result in a structure having the size of an area over which the gate electrode 12 overlaps the drain area being smaller than the size of an area over which the gate electrode 12 overlaps the source area.

As described above, it is possible to reduce the TFT OFF currents by making small the size of the area over which the gate electrode 12 overlaps the drain region. FIG. 7 shows results of relationships between the gate voltage Vg (V) and the source-drain currents Ids (A) obtained for TFT 10A of FIG. 6(*a*) and TFT 10B of FIG. 6(*b*). The horizontal axis in FIG. 7 represents the gate voltage Vg (V), and the vertical axis represents the source-drain currents Ids (A). It shows results in the cases of the source drain voltage Vds (V) being 5 V and 10 V.

Here, TFT 10B of FIG. 6(*b*) is comparable to TFT 10A of FIG. 6(*a*), but with the source and the drain interchanged. A drain electrode 18*db* includes a recess 18*db*1, and an intermediate electrode 18*mb* has a part 18*mb*2 protruding into the recess 18*db*1 of the drain electrode 18*db*. Furthermore, intermediate electrode 18*mb* includes a recess 18*mb*1, and a source electrode 18*sb* has a part 18*sb*1 protruding into the recess 18*mb*1 of the intermediate electrode 18*mb*. Therefore, the size of an area over which gate electrode 12 overlaps the drain region is larger than the size of an area over which gate electrode 12 overlaps the source region in TFT 10B.

Figure 7:
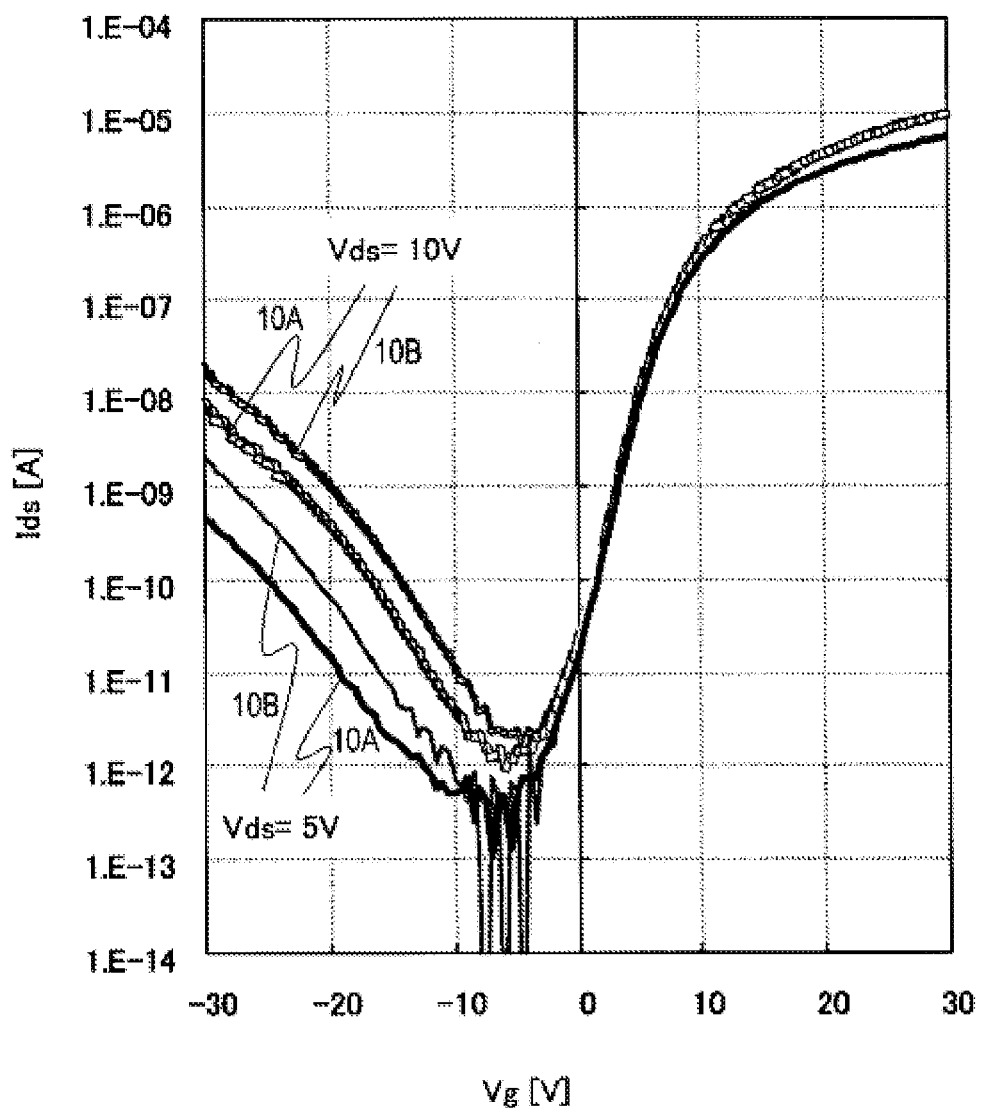
FIG. 7 is a graph showing a relationship between a gate voltage Vg (V) and source-drain current Ids (A) of TFT 10A and TFT 10B.

As shown in FIG. 7, OFF currents in TFT 10A are lower than in TFT 10B both when the source-drain voltage Vds (V) is 5 V and when Vds is 10 V. These results demonstrate that reducing the size of the area over which gate electrode 12 overlaps the drain region can reduce the TFT OFF currents.

The magnitude of OFF current depends on the size of an area over which the gate electrode 12 overlaps the drain region. In this sense, the relative size of this area with respect to the size of an area over which the gate electrode 12 overlaps the source region is unimportant. However, when the size of the area over which the gate electrode 12 overlaps the drain region is made smaller in order to reduce the TFT OFF currents, there is produced an asymmetrical structure in which the size of the area over which the gate electrode 12 overlaps the drain region is smaller than the size of the area over which the gate electrode 12 overlaps the source region.

Furthermore, the TFT characteristics are known to depend on the channel width, and a wider channel is preferred. As shown in FIG. 6(*a*), a wide channel can be achieved with U-shaped channel regions, which results from intermediate electrode 18*ma* and source electrode 18*sa* having the U-shaped recesses 18*ma*2 and 18*sa*1.

Other TFT structures according to preferred embodiments of the present invention will be described next with reference to FIG. 8.

Figure 8:
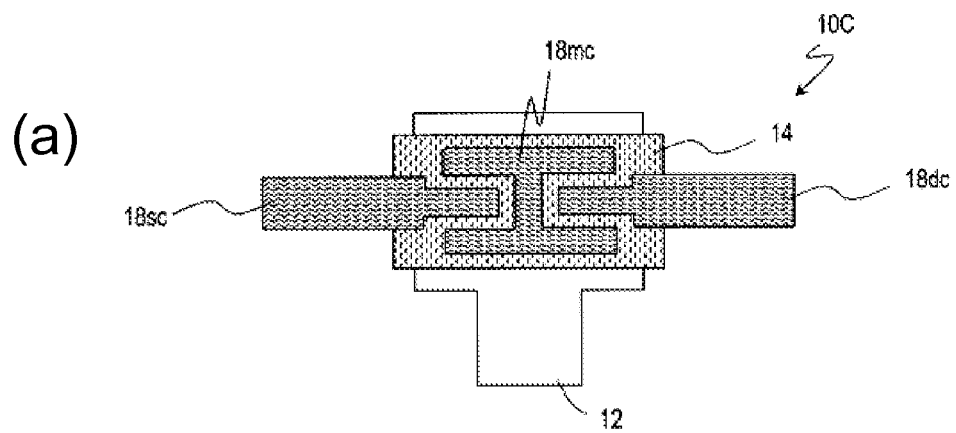
FIG. 8(a) is a schematic plan view of a TFT 10C according to a preferred embodiment of the present invention.
FIG. 8(b) is a schematic plan view of a TFT 10D according to a preferred embodiment of the present invention.
FIG. 8(c) is a schematic plan view of a TFT 10E according to a preferred embodiment of the present invention.
Figure 8:
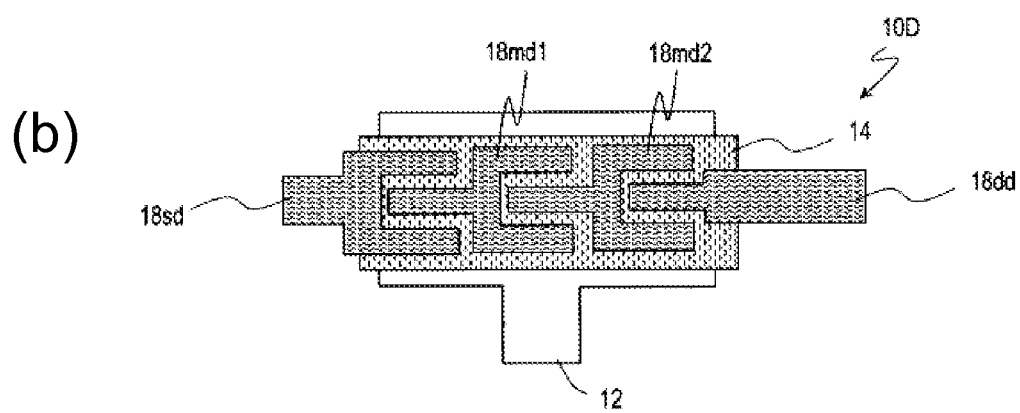
Figure 8:
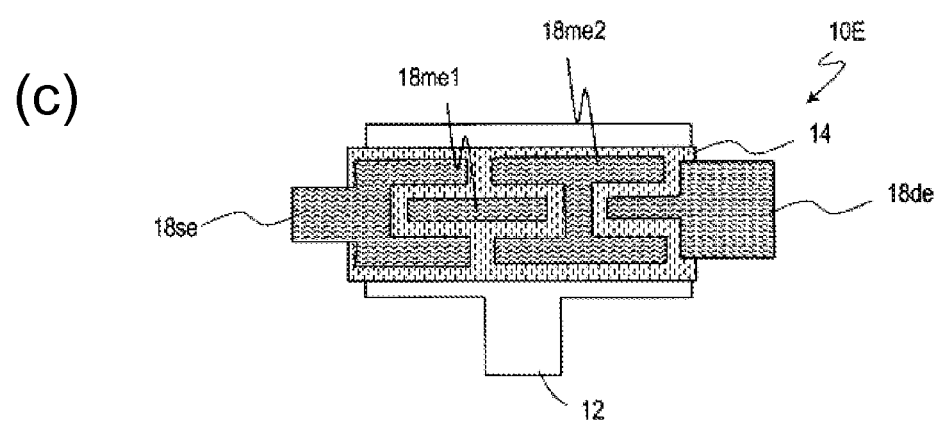

FIG. 8(*a*) shows a plan view schematic of a TFT 10C of a preferred embodiment of the present invention. TFT 10C has a dual gate structure similar to TFT 10 in FIG. 1(*a*). TFT 10C includes an intermediate electrode 18*mc* having a shape of the letter H with U-shaped recesses on a drain side and a source side. A drain electrode 18*dc* and a source electrode 18*sc* each have a protruding part that protrudes into the respective recess of the intermediate electrode 18*mc*. As compared with TFT 10, the size of an area over which a gate electrode 12 overlaps the drain region is smaller in TFT 10C, and two channel regions of TFT 10C are wider. As a result, TFT 10C offers smaller OFF currents and superior TFT characteristics than TFT 10.

FIG. 8(*b*) shows a plan view schematic of a TFT 10D according to a preferred embodiment of the present invention. While TFT 10A in FIG. 6(*a*) has a dual gate structure, TFT 10D has a triple gate structure having two intermediate electrodes 18*md*1 and 18*md*2. That is, a first channel region is formed between a source electrode 18*sd* and the first intermediate electrode 18*md*1; a second channel region is formed between a drain electrode 18*dd* and the second intermediate electrode 18*md*2; and a third channel region is formed between the first intermediate electrode 18*md*1 and the second intermediate electrode 18*md*2.

Although not shown in the figure, a first intermediate contact region is formed in a contact layer beneath the first intermediate electrode 18*md*1, and a first intermediate region is formed in an active layer beneath the first intermediate contact region. Furthermore, a second intermediate contact region is formed in a contact layer beneath the second intermediate electrode 18md2; and a second intermediate region is formed in an active layer beneath the second intermediate contact region.

In each of the three channels in TFT 10D, a portion that functions as a drain electrode is a protruding part (protruding parts of intermediate electrodes 18md1 and 18md2 and a protruding part of drain electrode 18dd) and is highly effective at reducing the OFF currents due to its small overlapping area with gate electrode 12. Furthermore, a portion that functions as a source electrode in each of the three channels includes a U-shaped recess, and there exist the protruding parts in the intermediate electrodes 18md1, 18md2 and drain electrode 18dd that protrude into the respective U-shaped recesses. As a result, the width of the three channel regions is large, and superior TFT characteristics are obtained.

FIG. 8(c) is a plan view schematic of a TFT 10E according to a preferred embodiment of the present invention. TFT 10E has a triple gate structure, including two intermediate electrodes 18me1 and 18me2, similar to TFT 10D in FIG. 8(b). That is, a first channel region is formed between a source electrode 18se and a first intermediate electrode 18me1; a second channel region is formed between a drain electrode 18de and a second intermediate electrode 18me2; and a third channel region is formed between the first intermediate electrode 18me1 and the second intermediate electrode 18me2. The second intermediate electrode 18me2 has a shape of the letter H and has U-shaped recesses on the drain side and the source side. A protruding part of the drain electrode 18de is within the recess on one side of second intermediate electrode 18me2, while one end of rectangular shaped intermediate electrode 18me1 is within the other recess of second intermediate electrode 18me2. Source electrode 18se has a U-shaped recess, and the other end of first intermediate electrode 18me1 is within the recess of source electrode 18se.

TFT 10E also has a structure in which the size of an area over which the gate electrode 12 overlaps the drain region is smaller than the size of an area over which the gate electrode 12 overlaps the source region, and has an advantage of smaller OFF currents.

Other TFT structures according to preferred embodiments of the present invention will be described with reference to FIGS. 9(a) through 9(c).

Figure 9:
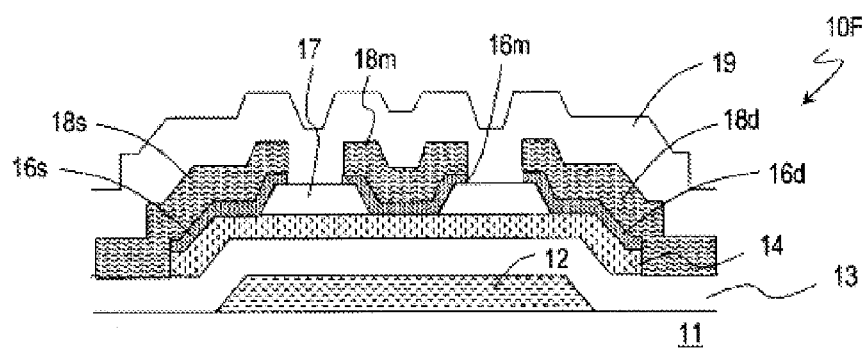
FIG. 9(a) is a cross-sectional schematic of a TFT 10F according to a preferred embodiment of the present invention.
FIG. 9(b) is a cross-sectional schematic of a TFT 10G according to a preferred embodiment of the present invention.
FIG. 9(c) is a cross-sectional schematic of a TFT 10H according to a preferred embodiment of the present invention.
Figure 9:
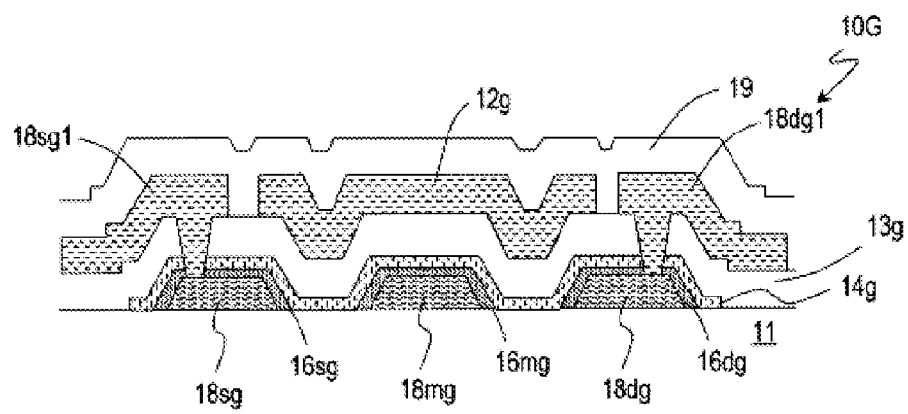
Figure 9:
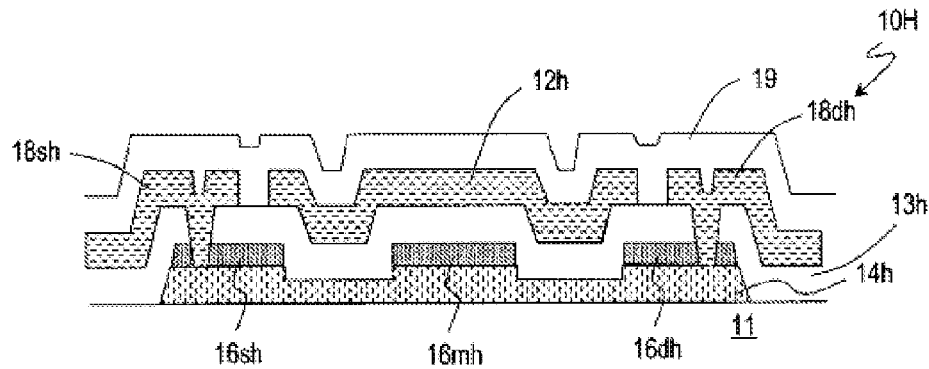

FIG. 9(a) shows a cross-sectional schematic of a TFT 10F according to a preferred embodiment of the present invention. TFT 10F differs from TFT 10 of FIG. 1, which is a channel etched TFT, in that it has an etch stop layer 17.

TFT 10F is manufactured by adding, in the manufacturing process of the TFT 10 shown in FIG. 4, a step of forming an etch stop layer 17 after the microcrystalline silicon film 14 is deposited. The etch stop layer 17 may be formed, for example, by depositing an SiNx film (having, for example, a thickness of 0.15 μm) and then patterning.

Because of etch stop layer 17, the active layer 14 (microcrystalline silicon film) is not etched when contact layer 16 (N+ silicon layer) is etched and isolated into source contact region 16s, drain contact region 16d, and intermediate contact region 16m. A resulting advantage is that the thickness of the active layer 14 may be controlled through the film deposition process. Another advantage is that the active layer 14 is not damaged from etching. Another advantage is a highly stable process, resulting from a continuous deposition of gate insulating film 13, active layer 14, and etch stop layer 17.

TFTs according to preferred embodiments of the present invention may also be top gate (staggered-type) TFTs shown in FIGS. 9(b) and 9(c).

A TFT 10G in FIG. 9(b) includes a source electrode 18sg, an intermediate electrode 18mg, and a drain electrode 18dg formed on a glass substrate 11; and a source contact region 16sg, a drain contact region 16dg, and an intermediate contact region 16mg, formed to cover these respective electrodes. An active layer 14g is formed to cover source contact region 16sg, drain contact region 16dg, and intermediate contact region 16mg. A gate insulating film 13g is formed further atop. A gate electrode 12g is formed to overlap the intermediate electrode 18mg (a portion between two channels), a portion of the source electrode 18sg, and a portion of drain electrode 18dg through the gate insulating film 13g. That is, TFT 10G has a double gate structure like TFT 10. Here, a source contact electrode 18sg1 and a drain contact electrode 18dg1 are formed using the same conductive layer as the gate electrode 12g and are in electrical contact with source electrode 18sg and drain electrode 18dg, respectively, inside contact holes formed in gate insulating film 13g, active layer 14g, and respective contact regions 16sg and 16dg.

An advantage of using such a top gate structure is that the top most part of active layer 14, which is formed of a microcrystalline silicon film, can be used as the channel region. When a microcrystalline silicon film is formed on a substrate, a lower-most layer of the amorphous phase, called an incubation layer, may sometimes form. Because the part that is in contact with the substrate is formed in an early part of the film deposition, it tends to contain voids and have a lower mobility. The top gate structure, on the other hand, does not include the incubation layer in the channel region, and therefore, can effectively utilize a high mobility offered by the microcrystalline silicon film.

A TFT 10H in FIG. 9(c) includes an active layer 14h formed on a substrate 11; a source contact region 16sh formed on active layer 14h; a drain contact region 16dh; and an intermediate contact region 16mh. Each contact region is isolated by channel etching, similar to TFT 10. A gate insulating film 13h is formed to cover the active layer 14h, the source contact region 16sh, the drain contact region 16dh, and the intermediate contact region 16mh. A gate electrode 12h is formed to overlap the entire intermediate contact region 16mh (a potion between two channels; also functioning as an intermediate electrode), a part of source contact region 16sh, and a part of drain contact region 16dh through gate insulating film 13h. That is, TFT 10H has a double gate structure like TFT 10. Here, a source contact electrode 18sh and a drain contact electrode 18dh are formed using the same conductive layer as the gate electrode 12h, and are in electrical contact with source electrode 18sh and drain electrode 18dh, respectively, inside contact holes formed in the gate insulating films 13h, the active layer 14h, and in the contact regions 16sh and 16dh, respectively.

Because TFT 10H also has a top gate structure, similar to TFT 10G, TFT 10H has an advantage of being able to use the top most part of active layer 14h formed with a microcrystalline silicon film as the channel region. Furthermore, TFT 10H offers another advantage in that a step for forming an intermediate electrode may be omitted, because intermediate contact region 16mh also functions as an intermediate electrode. A structure in which the intermediate contact region also functions as the intermediate electrode is not limited to TFT 10H and may also be applied to the other TFTs that have been described above.

As described above, the TFTs according to the preferred embodiments of the present invention may have either bottom gate or top gate structure, and can reduce the OFF currents. Furthermore, because the TFTs according to the preferred embodiments of the present invention have a microcrystalline silicon film as the active layer, they can achieve high mobilities and low OFF currents. The same benefits are achieved not only when the active layer is made solely of a microcrystalline silicon film, but also when the active layer is a multi-layer film of a microcrystalline silicon film and an amorphous silicon film. In order to take advantage of a high mobility of the microcrystalline silicon film, the microcrystalline silicon film should preferably be positioned on the gate electrode side of the amorphous silicon film, so that the channel may be formed inside the microcrystalline silicon film. While the preferred embodiments of the present invention that have been described here are TFTs having semiconductor films including only silicon, the preferred embodiments of the present invention are not limited by the types of semiconductor films and may be applied to TFTs having other microcrystalline semiconductor films for which a reduction in the OFF current is desirable, such as, for example, microcrystalline SiGe films and microcrystalline SiC films.

Furthermore, the use of the TFTs of the preferred embodiments of the present invention is not limited to the TFTs for pixels, and may also be used for TFTs for peripheral circuits, such as a driver.

INDUSTRIAL APPLICABILITY

The semiconductor devices of the present invention have a wide range of applications, including active matrix substrates and other circuit boards; liquid crystal display devices, organic electroluminescence (EL) display devices and inorganic electroluminescence display devices and other display devices; flat panel x-ray image sensor devices and other image capturing devices; image input devices, fingerprint readers, and other electronic devices; and other wide ranging devices having thin film transistors.

| Description of Reference Numerals | |
|---|---|
| 10, 10A, 10B, 10C, 10D, 10E, 10F, 10G, 10H | TFT |
| 11 | substrate (glass substrate) |
| 12 | gate electrode |
| 13 | gate insulating film |
| 14 | active layer (semiconductor layer) |
| 14c1, 14c2 | channel regions |
| 14s | source region |
| 14d | drain region |
| 14m | intermediate region |
| 16 | contact layer |
| 16s | source contact region |
| 16d | drain contact region |
| 16m | intermediate contact region |
| 17 | etch stop layer |
| 18s | source electrode |
| 18d | drain electrode |
| 18m | intermediate electrode |
| 19 | protective film |

The invention claimed is:

1. A semiconductor device, comprising:
an active layer supported by a substrate, the active layer having at least two channel regions, a source region, a drain region, and at least one intermediate region formed between said at least two channel regions;
a contact layer having a source contact region in contact with said source region, a drain contact region in contact with said drain region, and at least one intermediate contact region in contact with said at least one intermediate region;
a source electrode in contact with said source contact region;
a drain electrode in contact with said drain contact region;
at least one intermediate electrode in contact with said at least one intermediate contact region; and
a gate electrode facing said at least two channel regions and said at least one intermediate region through a gate insulating film interposed therebetween,
wherein said at least two channel regions include a first channel region formed between said source region and said at least one intermediate region and a second channel region formed between said drain region and said at least one intermediate region,
wherein an entire portion of said at least one intermediate electrode that is located between said first channel region and said second channel region overlaps said gate electrode through said at least one intermediate region and said gate insulating film, and
wherein said intermediate electrode has a recess, and said drain electrode has a portion that protrudes into said recess of said intermediate electrode, as viewed from a direction perpendicular to said substrate.

2. The semiconductor device according to claim 1, wherein said gate electrode further includes portions that overlap said source region and said drain region, and the size of the portion of said gate electrode that overlaps said drain region is smaller than the size of the portion of said gate electrode that overlaps said source region.

3. The semiconductor device according to claim 1, wherein said source electrode has a recess, and said at least one intermediate electrode has a portion that protrudes into said recess of said source electrode, as viewed from a direction perpendicular to said substrate.

4. The semiconductor device according to claim 1, wherein said at least one intermediate region includes a first intermediate region and a second intermediate region, said at least one intermediate contact region includes a first intermediate contact region and a second intermediate contact region, and said at least one intermediate electrode includes a first intermediate electrode and a second intermediate electrode, and
wherein said at least two channel regions further includes a third channel region, said first channel region is formed between said source electrode and said first intermediate electrode, said second channel region is formed between said drain electrode and said second intermediate electrode, and said third channel region is formed between said first intermediate electrode and said second intermediate electrode.

5. The semiconductor device according to claim 1, wherein said active layer includes a microcrystalline semiconductor layer having crystal grains and an amorphous phase.

6. The semiconductor device according to claim 1, wherein said gate electrode is formed between said active layer and said substrate.

7. The semiconductor device according to claim 1, wherein said active layer is formed between said gate electrode and said substrate.

8. An active matrix substrate comprising a semiconductor device according to claim 1.

9. A display device comprising a semiconductor device according to claim 1.

10. A semiconductor device comprising:
a gate electrode;
a gate insulating layer on the gate electrode;
a semiconductor active layer disposed to overlap the gate electrode through the gate insulating layer;
a first impurity-doped semiconductor part in contact with a first portion of the active layer, providing contact for a source;

a second impurity-doped semiconductor part in contact with a second portion of the active layer, providing contact for a drain; and a third impurity-doped semiconductor part coupled to a third portion of the active layer, the third impurity-doped semiconductor part being electrically floated and separated from the first and second impurity-doped semiconductor parts, an entirety of the third impurity-doped semiconductor part being covered by the gate electrode through the gate insulating layer, wherein the gate electrode overlaps a portion of the first impurity-doped semiconductor part and a portion of the second impurity-doped semiconductor part, wherein the portion of the second impurity-doped semiconductor part that is overlapped with the gate electrode is smaller in area than the portion of the first impurity-doped semiconductor part that is overlapped with the gate electrode, wherein, as viewed from a direction normal to a surface of the gate electrode, the third impurity-doped semiconductor part has a recess, and the second impurity-doped semiconductor part has a protrusion protruding into the recess of the third impurity-doped semiconductor part.

11. The semiconductor device according to claim 10, further comprising a substrate, wherein the gate electrode, the gate insulating layer and the semiconductor active layer are disposed over the substrate in that order from the substrate.

12. The semiconductor device according to claim 10, further comprising a substrate, wherein the semiconductor active layer, the gate insulating layer, and the gate electrode are disposed over the substrate in that order from the substrate.

13. A semiconductor device, comprising:
an active layer supported by a substrate, the active layer having at least two channel regions, a source region, a drain region, and at least one intermediate region formed between said at least two channel regions;
a contact layer having a source contact region in contact with said source region, a drain contact region in contact with said drain region, and at least one intermediate contact region in contact with said at least one intermediate region;
a source electrode in contact with said source contact region;
a drain electrode in contact with said drain contact region;
at least one intermediate electrode in contact with said at least one intermediate contact region; and
a gate electrode facing said at least two channel regions and said at least one intermediate region through a gate insulating film interposed therebetween, wherein said at least two channel regions include a first channel region formed between said source region and said at least one intermediate region and a second channel region formed between said drain region and said at least one intermediate region, wherein an entire portion of said at least one intermediate electrode that is located between said first channel region and said second channel region overlaps said gate electrode through said at least one intermediate region and said gate insulating film, and wherein said source electrode has a recess, and said at least one intermediate electrode has a portion that protrudes into said recess of said source electrode, as viewed from a direction perpendicular to said substrate.

14. The semiconductor device according to claim 13, wherein said gate electrode further includes portions that overlap said source region and said drain region, and the size of the portion of said gate electrode that overlaps said drain region is smaller than the size of the portion of said gate electrode that overlaps said source region.

15. The semiconductor device according to claim 13, wherein said at least one intermediate region includes a first intermediate region and a second intermediate region, said at least one intermediate contact region includes a first intermediate contact region and a second intermediate contact region, and said at least one intermediate electrode includes a first intermediate electrode and a second intermediate electrode, and
wherein said at least two channel regions further includes a third channel region, said first channel region is formed between said source electrode and said first intermediate electrode, said second channel region is formed between said drain electrode and said second intermediate electrode, and said third channel region is formed between said first intermediate electrode and said second intermediate electrode.

16. The semiconductor device according to claim 13, wherein said active layer includes a microcrystalline semiconductor layer having crystal grains and an amorphous phase.

17. The semiconductor device according to claim 13, wherein said gate electrode is formed between said active layer and said substrate.

18. The semiconductor device according to claim 13, wherein said active layer is formed between said gate electrode and said substrate.

19. An active matrix substrate comprising a semiconductor device according to claim 13.

20. A display device comprising a semiconductor device according to claim 13.

* * * * *